United States Patent
Droz (10) Patent No.: US 6,176,010 B1
(45) Date of Patent: Jan. 23, 2001

(54) METHOD FOR MAKING PRINTED CIRCUITS AND RESULTING PRINTED CIRCUIT

(75) Inventor: François Droz, La Chaux-de-Fonds (CH)

(73) Assignee: NagraID S.A., La Chaux-de-Fonds (CH)

( * ) Notice: Under 35 U.S.C. 154(b), the term of this patent shall be extended for 0 days.

(21) Appl. No.: 09/214,967

(22) PCT Filed: Jul. 18, 1996

(86) PCT No.: PCT/CH96/00262

§ 371 Date: Jan. 15, 1999

§ 102(e) Date: Jan. 15, 1999

(87) PCT Pub. No.: WO98/04105

PCT Pub. Date: Jan. 29, 1998

(51) Int. Cl.[7] .................................................. H05K 3/30
(52) U.S. Cl. ................ 29/832; 29/841; 29/846; 29/600; 174/250; 174/261
(58) Field of Search ............... 29/827, 850, 829, 29/830, 846, 841, 832, 600; 174/250, 261

(56) References Cited

U.S. PATENT DOCUMENTS

| | | | |
|---|---|---|---|
| 2,622,054 | * | 12/1952 | Franklin . |
| 3,911,716 | * | 10/1975 | Weglin ................................ 29/846 |
| 4,138,924 | | 2/1979 | Seebach . |
| 4,356,627 | * | 11/1982 | Hoffman . |
| 4,555,291 | | 11/1985 | Tait et al. . |
| 4,694,283 | * | 9/1987 | Reeb ..................................... 29/846 |
| 4,970,495 | * | 11/1990 | Matsumoto et al. .................... 29/846 |
| 4,990,891 | * | 2/1991 | Reeb ..................................... 29/846 |
| 5,649,352 | * | 7/1997 | Gustafson ............................. 29/850 |
| 5,671,525 | * | 9/1997 | Fidalgo ................................. 29/827 |
| 5,809,633 | * | 9/1998 | Mundigl et al. ....................... 29/827 |

FOREIGN PATENT DOCUMENTS

| | | |
|---|---|---|
| 3330738A1 | 7/1985 | (DE) . |
| 2137991 | 12/1972 | (FR) . |
| 26 74724 | 2/1992 | (FR) . |
| 1138628 | 1/1969 | (GB) . |
| 9119302 | 12/1991 | (WO) . |

* cited by examiner

*Primary Examiner*—Carl J. Arbes
(74) *Attorney, Agent, or Firm*—Clifford W. Browning; Woodard, Emhardt, Naughton, Moriarty & McNett (57) ABSTRACT

Method of producing a printed circuit starting from a dielectric film covered by one or more superficial metallic conducting layer(s), comprising a step of demarcation of different conducting paths by mechanical machining of incisions in the conducting layer. The machining is carried out by means of a sharp-edged cutting tool allowing incisions to be cut separating said conducting paths, without removal of conducting material or depthwise indentation. For example, a stamping die or a cutting table controlling a blade can be used to cut the incisions. The method is suitable for multi-layered circuits, and is particularly adapted to flexible printed circuits, to connectors, etc. and to inductance coils used, for example, in chip cards.

14 Claims, 5 Drawing Sheets

METHOD FOR MAKING PRINTED CIRCUITS AND RESULTING PRINTED CIRCUIT

TECHNICAL FIELD

This invention concerns a method for producing printed circuits according to the preamble of claim 1. Moreover the invention likewise concerns a printed circuit, for example an inductance coil whose turns are constituted by the paths of the printed circuit, made according to this method.

PRIOR ART

In the technology of chip cards and of transponders, it is often desired to connect an induction coil with an electronic circuit, for example an integrated circuit, mounted on a printed circuit board. Such a configuration is described, for example, in WO 91/19302. The coil is generally produced by winding a wire around a core. Such coils are complex to make, thus relatively costly. Moreover the connection between the printed circuit and the coil gives rise to certain additional problems of mounting and poses problems of reliability, in particular when these elements are integrated in a chip card not offering adequate protection against deformation and mechanical stresses. Furthermore the thickness of the coil often poses a problem as well when it has to be integrated into a miniaturised device or in a chip card in which one hopes to keep the standard thickness of 0.76 mm.

To reduce these difficulties, devices are also known in which the turns of the inductance are constituted directly by the conducting paths of the printed circuit. The paths of the printed circuit are generally realised by photochemical means, which necessitates numerous costly operations and the use of polluting substances.

U.S. Pat. No. 4,555,291 describes an essentially mechanical method of producing a printed circuit. A fine metallic film is cut beforehand in spiral shape. The different turns are not totally separated in order to make the cut spiral rigid. The spiral is then fixed to a sheet of dielectric material, and a second cutting device is set in operation to block the interconnections between turns, a circuit of inductive nature remaining.

This solution is complex to apply and necessitates, in particular, two distinct cutting operations. The thickness of the pre-cut metallic film must be sufficient so that it can be transported without becoming deformed or torn. The width of the turns and of the intervals which have been cut between the turns must likewise be sufficient to ensure a minimum of rigidity of the film before stratification on the dielectric support.

Other methods of producing a printed circuit are known starting from a synthetic film covered by a superficial conducting layer in which the different conducting paths are demarcated by mechanical stamping of the said conducting layer carried out by means of a stamping die. FR-2 674 724, GB-1138628, or U.S. Pat. No. 4,356,627, for example, describe variants of such a method. It is difficult to obtain paths of very reduced width with these stamping techniques. Moreover, the synthetic film must have a sufficient thickness to support the stamping pressure and remain sufficiently rigid even in the regions stamped in by the stamping die.

The other known methods of producing a printed circuit starting with a synthetic film covered by a superficial conducting layer comprise an operation of demarcation of different conducting paths constituting the printed circuit by cutting of the superficial layer of the printed circuit (cf. DE-3 330 738 and U.S. Pat. No. 4,138,924). The interstices between conducting paths thus necessarily have a sufficiently large width corresponding to at least the width of the milling tool. It is therefore not possible to obtain an optimal density of paths. Moreover, the cutting produces slivers which must be carefully removed to prevent possible short circuits between paths. When the superficial metallic layer is made of a costly material, for example of silver, there is waste of material.

DE-2 758 204 describes a method of producing a circuit, in particular of inductance in the form of a printed circuit, in which the different paths constituting the turns of the coil are demarcated by thermo-mechanical machining of a synthetic film covered by a superficial metallic layer. A heated metallic point (3) passes through the superficial layer of metal and simultaneously causes part of the synthetic layer to melt beneath the metal.

This method is more specifically adapted to producing different kinds of devices or to coils whose thickness is not crucial. The synthetic layer (1) must be thick enough for an incision to be made with the point (3) and be heated at the same time without being completely cut through. Control of the temperature of the point poses additional difficulties; moreover, the metallic point (3) must be moved slowly enough for the synthetic material to have the melting temperature. This method is thus unsuitable for producing coils which must be integrated, for example, in smart cards and whose thickness as well as cost and time of manufacture must be kept at a minimum.

One object of the present invention is thus to propose an improved method of producing a printed circuit, in particular when it is used to make inductance coils for a chip card whose turns are constituted by the conducting paths of the printed circuit.

DESCRIPTION OF THE INVENTION

According to one aspect of the invention, this object is attained by means of a method of manufacture of a printed circuit such as is specified in claim 1.

This method allows the mentioned drawbacks of the prior art to be avoided.

Moreover, this method permits a printed circuit of remarkable surface evenness to be obtained. When the printed circuit is integrated in a chip card it is therefore easier to obtain absolutely flat external faces which notably facilitates the printing of possible motifs.

The invention also concerns printed circuits produced by this method, in particular coils or connectors made by this method. The invention concerns in addition chip cards incorporating a coil made by this method and/or a printed circuit made by this method.

Variants of the invention, in particular those specified by the dependent claims, allow, moreover, the density of the circuits obtained and/or of the inductance of the coils obtained to be further increased.

BRIEF DESCRIPTION OF THE DRAWINGS

Other aspects advantages of the invention will follow from the description and the attached figures which show.

Figure 1:
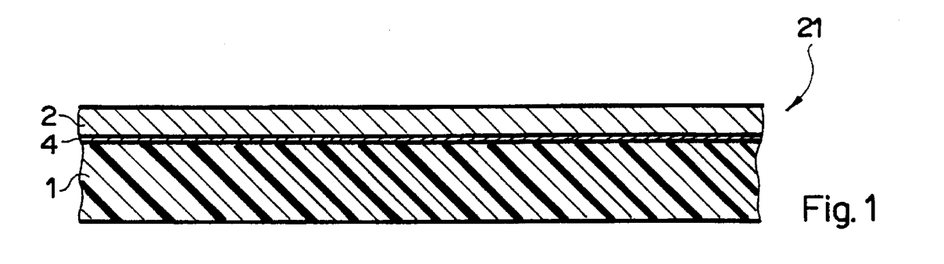
FIG. 1, a cut-away view of a dielectric film covered by a superficial conducting layer suitable to be used with the present invention, FIG. 2, a cut-away view of stamping die and of a dielectric film covered by a superficial conducting layer before demarcation of the conducting paths, FIG. 3, a cut-away view of a dielectric film covered by a superficial conducting layer after demarcation of the conducting paths, FIG. 4, a cut-away view of a dielectric film covered on each face by a superficial conducting layer after demarcation of the conducting paths on each face, FIG. 5, cut-away view of a dielectric film covered on one face by a plurality of superficial conducting layers after demarcation of the conducting paths, FIG. 6, a cut-away view of a dielectric film covered on one face by a plurality of superficial conducting layers after demarcation of the conducting paths, FIG. 7, a later of different cutting tools which can be used in the method according to the invention, FIG. 8, a view in perspective of a chip card comprising a printed circuit on a single face according to the invention, FIG. 9, a view in perspective of a chip card comprising a printed circuit according to the invention mounted between two sheets of protection, FIG. 10, a view in perspective of a printed circuit before bending, made according to a variant of the invention comprising a bending step.

FIG. 1 shows a cut-away view of a film 1 covered by a superficial conducting layer 2. The film 1 is preferably composed of any dielectric material, for example a synthetic material of the PVC type or of cardboard. Depending upon the application, a flexible film or, on the contrary, a more rigid substrate will be chosen. The film 1 can also be composed of a composite or multi-layered material, for example a stratified material comprising a plurality of layers of synthetic material, of cardboard and/or of metal.

The superficial conducting layer 2 is applied to the film 1 using a known method and is maintained, for example, by soldering or by means of adhesive 4. The adhesive 4 can, for example, be a hot-setting adhesive or a cold-setting adhesive; it is also possible to use, instead of adhesive 4, a double-faced adhesive sheet or a thermo-adhesive film. The layer 2 is made of an appropriate metal, for example copper, aluminium, silver or a conducting alloy.

In a variant, the superficial conducting layer 2 is applied by gluing on a metallic sheet instead of on a dielectric film. The insulation between conducting paths (see below) is thus ensured solely by the layer of adhesive 4 which fulfils the role of the dielectric film. The layer of adhesive 4 is this case must be perfectly insulating electrically.

Figure 2:
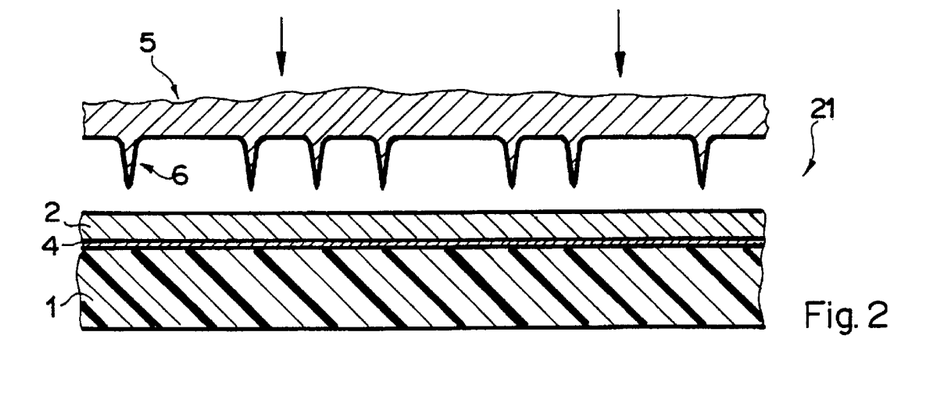

FIG. 2 shows a cut-away view of a stamping die 5 on top of a dielectric film before demarcation of conducting paths. The stamping die 5 has sharp-edged surfaces of contact 6 with the superficial layer 2 on the synthetic film 1.

The stamping die 5 is lowered, by means not shown, with a pressure just sufficient so that the sharp-edged surfaces of contact 6 perforate and cut the superficial metallic layer 2. The profile of the surfaces 6 is sufficiently sharp-ened that the die cuts fine incisions in the layer 2 without removing conducting material as in the methods of milling and without depthwise indentation as in the stamping methods of the type described in GB 1,138,628. Here, according to the present invention, the metallic material is incised by the surfaces 6.

Figure 3:
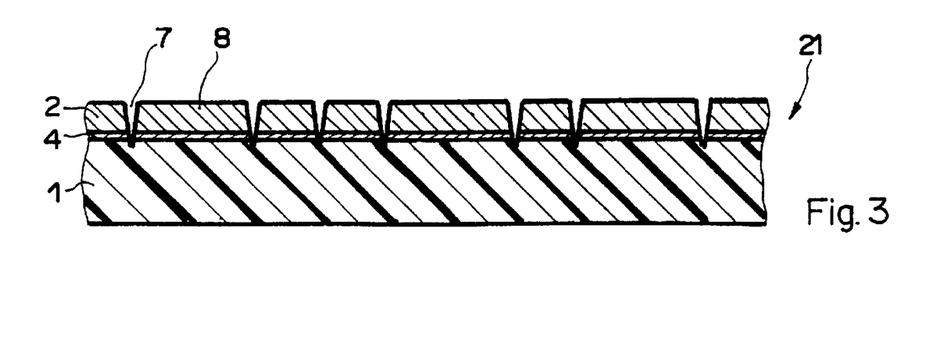

FIG. 3 shows a cut-away view of a dielectric film 1 covered with a metallic layer 2 after demarcation of conducting paths 8. It can be seen that the incisions 7 are just deep enough to pass through the metallic layer 2, the possible adhesive layer 4 and possibly graze the dielectric, synthetic layer 1. In a variant, the incisions 7 completely pass through the superficial metallic layer only, the bottom of the incisions being in the vicinity of the adhesive layer 4. In this way the synthetic film 1 is made as weak as is necessary by machining demarcations between conducting paths 8, and can have a minimal thickness.

To optimise the density of the conducting paths 8 on the printed circuit, the width of the incisions 7 is as fine as possible. If the substrate 1 is particularly flexible, the width will nonetheless be sufficient to avoid any risk of short circuiting of the conducting paths 8.

An adapted arrangement of conducting paths 8, for example in spiral, enables inductive elements to be easily achieved, whose turns are constituted by the conducting paths of the printed circuit. Supplementary traditional machining operations, for example drilling and soldering, can then be carried out to fix the discrete components on the printed circuit thus made.

Figure 4:
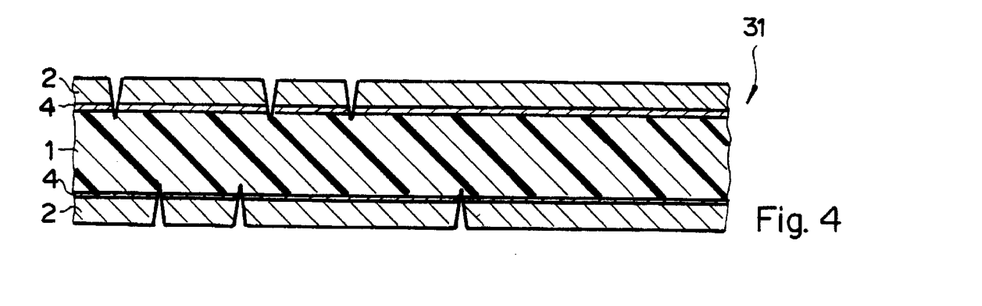

FIG. 4 illustrates a cut-away view of a dielectric film 1 covered on each face by a superficial conducting layer 2 after demarcation of conducting paths 8 on each face. The incisions 7 delimiting the paths 8 on each face are preferably realised in a single operation. To do this, the dielectric film 1 covered on each face with a conducting layer 2 is held tightly between two stamping dies (not shown) which each have sharp-edged surfaces of contact 6 with the metallic surface. However, it is also possible to realise the incisions 7 on the two faces in two operations, one face after the other.

Since the method according to the invention can be used even with dielectric films 1 of very fine thickness, this variant allows capacitive elements to be made very simply whose plates are formed by the metallic paths superimposed on each face. These components can, for example, be combined with inductive elements to constitute LC resonant circuits of reduced volume. If the capacitive coupling between the paths on the two faces must be reduced, patterns of conducting paths on the two faces having a minimum of overlapping will be chosen instead.

Figure 5:
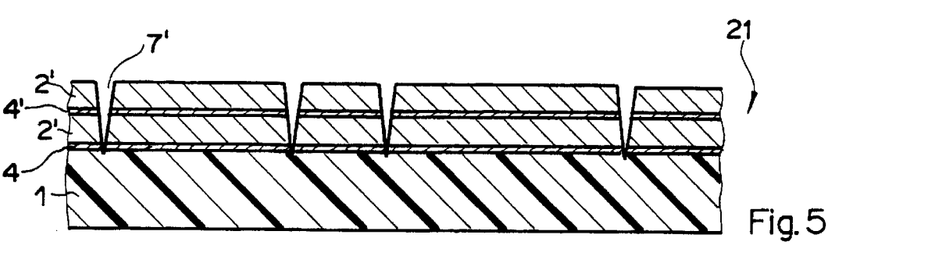

FIG. 5 illustrates a cut-away view of a dielectric film covered on one of its faces with a plurality of superficial conducting layers after demarcation of the conducting paths. The dielectric film 1 is covered in this example with a first metallic film 2 fixed by a first layer of adhesive 4. A second metallic film 2' is fixed on the first film 2 by a second layer of adhesive 4'. The second layer of adhesive 4' likewise acts as insulator between the two metallic layers 2 and 2'. If necessary, it is also possible to insert a supplementary insulating layer between the two metallic layers, for example a supplementary synthetic layer. Of course it is also possible to superpose more than two metallic layers 2, 2', one above the other.

In this variant, the cutting tool 5 used to separate the conducting paths 8 is designed so as to cut the incisions deep enough to pass through all the metallic layers 2, 2', etc. in a single operation. The pattern constituted by the conducting paths 8 on the different conducting layers 2, 2', etc. is thus identical. By connecting the different layers to one another at appropriate places, for example with metallised holes, this arrangement allows circuits of elevated inductance to be achieved.

Figure 6:
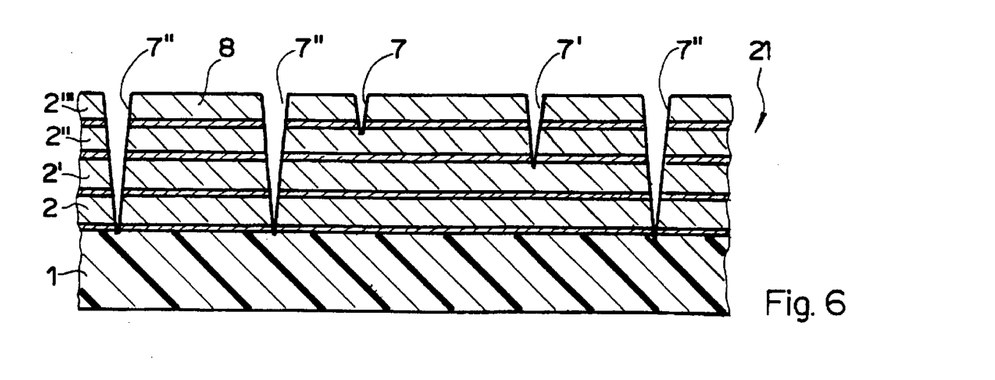

It is of course possible to produce multi-layered circuits with variable patterns on the different layers. FIG. 6 illustrates an example of a dielectric film 1 covered on its upper face with four superficial conducting layers 2, 2', 2", 2'", insulated and mutually fixed by an adhesive 4, 4', 4", 4'". The depth of the incisions 7 machined in a single operation by the cutting tool is variable here; certain incisions 7" thus pass through all the superposed metallised layers whereas others (7) pass only through the upper layer 2''', still others (7') passing through a plurality of layers 2''', 2'', but not all. In this way different topologies of paths can be realised on the different layers.

Only particular circuits in which the conducting paths on the lower metallic layers 2 are constituted by juxtaposition of one or more paths on the upper layers, can be obtained by machining incisions on a multi-layered film in a single operation. To obtain multi-layered circuits with a topology of conducting paths completely free on each layer, it is necessary to foresee a plurality of successive operations:

lamination of one or more first metallised lower layers on a dielectric film machining of incisions demarcating the conducting paths on this first layer or these first layers lamination of upper metallised layers machining of incisions demarcating conducting paths on this upper layer or these upper layers.

One skilled in the art will of course understand that it is possible to combine freely the variants mentioned above. For example, it is possible to achieve circuits covered with a plurality of superficial conducting layers on each face.

The machining of incisions 7, 7', 7'', as described above, by means of a stamping die having sharp-edged surfaces of contact with the superficial conducting layer, is very quick, but requires beforehand the making of a stamping die with the pattern of demarcations between the conducting paths. This solution is therefore suitable only for the manufacture of printed circuits in large or medium-sized series. Moreover, to ensure a clean cut of the metallic layers, it is necessary from time to time to replace or to sharpen the cutting surfaces of the stamping die.

In a variant particularly adapted to the manufacture of smaller series or of prototypes, the incisions 7, 7', 7'' can be cut by means of a conventional cutting table known, for example, in the field of cutting of self-adhesive films for publicity or other creations. In this case, the pattern of demarcations between conducting layers is designed beforehand on a computer by means of adapted software, then stored in an electronic memory. This design is then used to control the sequential displacement of a blade 10 on the cutting table.

Figure 7:
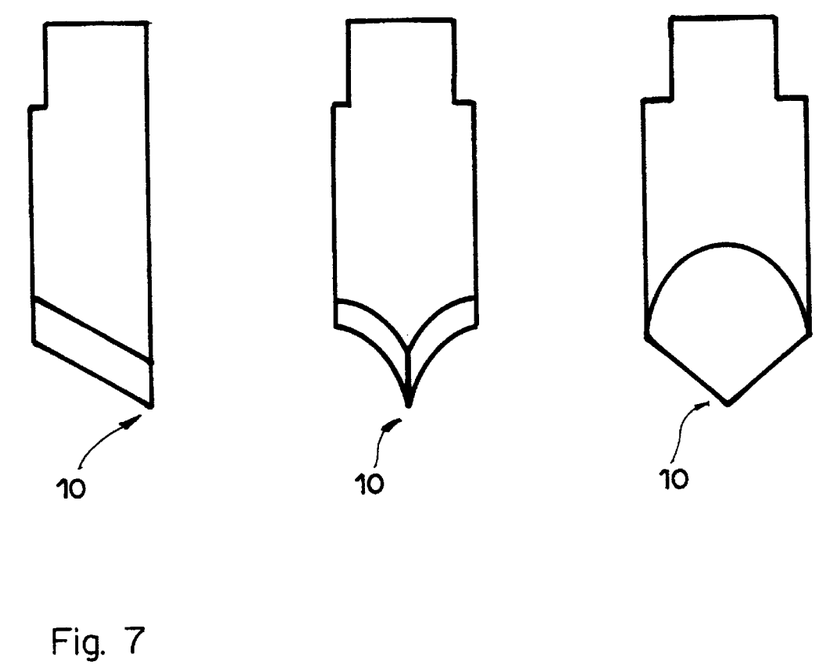

Certain cutting tables allow a control of the direction of the blade in the quarter circles and/or movements of come and go of the blade. The shape of the blade 10 will be chosen as a consequence, for example from among the variants of FIG. 7 and according to the thickness of the metallic layer to be cut. The blade is sufficiently sharp to cut the superficial layer without removal of conducting material nor depthwise indentation. Its width is minimal so that conducting paths 8 of maximal width remain. The depth is just sufficient to pass through the superficial metallic layer without weakening too much the dielectric layer 1, which will thus have a minimal thickness. If incisions of varied depth are required, for example to produce multi-layered circuits with variable patterns on the different layers (FIG. 6), it is necessary to replace the blade at each desired change of depth. It is also possible to use a cutting table provided with a plurality of blade holders equipped with blades of different depths, or to provide means to control the depth of penetration of the blade.

Depending upon the width of the incisions 7 and flexibility of the substrate 1, the electrical contacts between neighbouring conducting paths 8 risk being formed when the incisions close themselves again in the case of deformation of the printed circuit. If necessary, any synthetic or thermoplastic material can be inserted or melted in the incisions 7 to ensure an electrical separation of the paths in all conditions.

Figure 8:
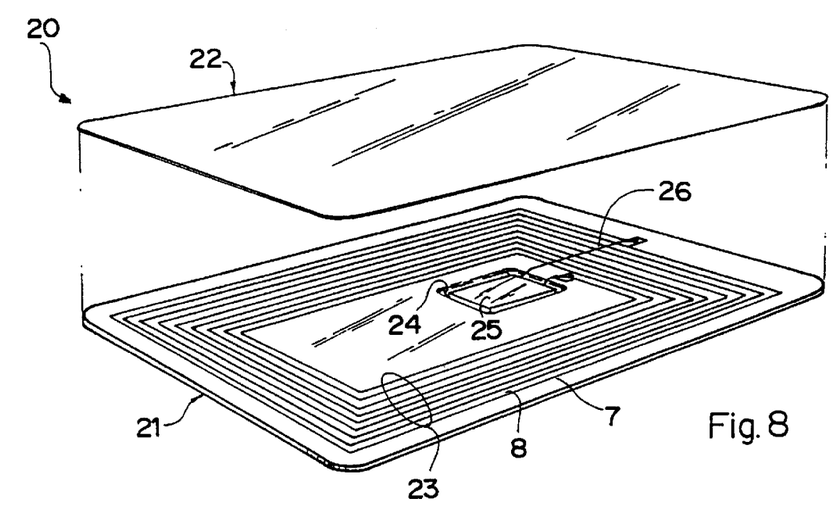

The invention is particularly suitable for the manufacture of printed circuits whose width and possibly weight can be minimised. For example, the method is ideal for printed circuits intended for chip cards. FIG. 8 illustrates an example of a chip card 20 according to the invention.

The chip card is constituted by a printed circuit 21 of a single face according to the invention, corresponding, for example, to one of the variants illustrated by the FIGS. 3, 5, or 6, and of an upper protective sheet and of decoration 22. The lower face of the sheet 21, which does not bear paths, can likewise be printed. The printed circuit 21 is formed by a sufficiently rigid substrate 1 and by one or more superficial conducting layers 2, 2', etc. Incisions 7 are machined according to the method described above in the conducting layer in such a way as to delimit a spiral conducting path 8 constituting an inductive element 23. The number of turns is chosen as a function of the desired inductance. Since the machining method of the invention produces incisions 7 of minimal width between the turns 8, it is possible to accommodate on a given surface a maximum of turns and thus to obtain an elevated induction. To increase the induction even more, a circuit of several conducting layers 2, 2', etc. will preferably be chosen according to the example of FIG. 5 or 6.

An accommodation 24 is provided in a portion of the lower sheet 21 not occupied by the conducting paths 8, in this example on the interior of the inductive element 23. An integrated circuit 25 is fixed in this accommodation 24 and connected at two ends of the inductive element 23. The connection between the circuit 25 and the inner portion of the inductive element 23 can be made directly. The connection with the outer portion of the inductive element can, on the other hand, be made by the agency of a bridge 26 above the turns 8. The bridge 26 can, for example, be constituted by a simple soldered wire above or below the conducting paths 8. In the case of a circuit of several conducting layers, it is also possible to use one of the metallised layers 2, 2', etc. to make the bridge 26. Finally, the bridge can be integrated in the substrate I before lamination of the conducting layers 2.

Depending upon the desired application and the available space remaining on the card, components other than the integrated circuit 25 and the inductive element 23 can be integrated on the printed circuit 21. It is possible, for example, to place on the circuit an accumulator (not shown) which could be recharged from the outside by means of the inductive element 23. These other components would ideally be mutually connected and with the elements 23 and 25 by means of conducting paths machined in the superficial conducting layer or layers 2 in the way described above.

After machining incisions 7 and connection of diverse components to one another, the upper protective sheet 22 is placed on the lower sheet 21 and mounted by known means, for example gluing. A hot-setting adhesive will be chosen, for example, which in melting fills the incisions 7 and thus prevents the mentioned risks of short circuits between neighbouring conducting paths.

One skilled in the art will note here that, contrary to the majority of known prior art techniques, the manufacture of conducting paths 8 on the printed circuit by the method according to the invention creates remarkably few surface irregularities, which are moreover compensated for by the adhesive. It is thus relatively easy to mount the upper sheet 22 while obtaining an absolutely flat external surface.

The accommodation 24 for the integrated circuit 25 in the lower sheet 21 could, if necessary, be completed by a corresponding accommodation in the upper sheet 22. It is also possible to do without the accommodation 24 in the lower sheet 21 and to use a deeper corresponding accommodation in the upper sheet 22. In a variant, the upper sheet 22 and/or the lower sheet 21 are provided with a window instead of an accommodation, leaving appear on the exterior of the card the circuit 25, the connection pins of the circuit 25, or contacts connected to the circuit 25.

Figure 9:
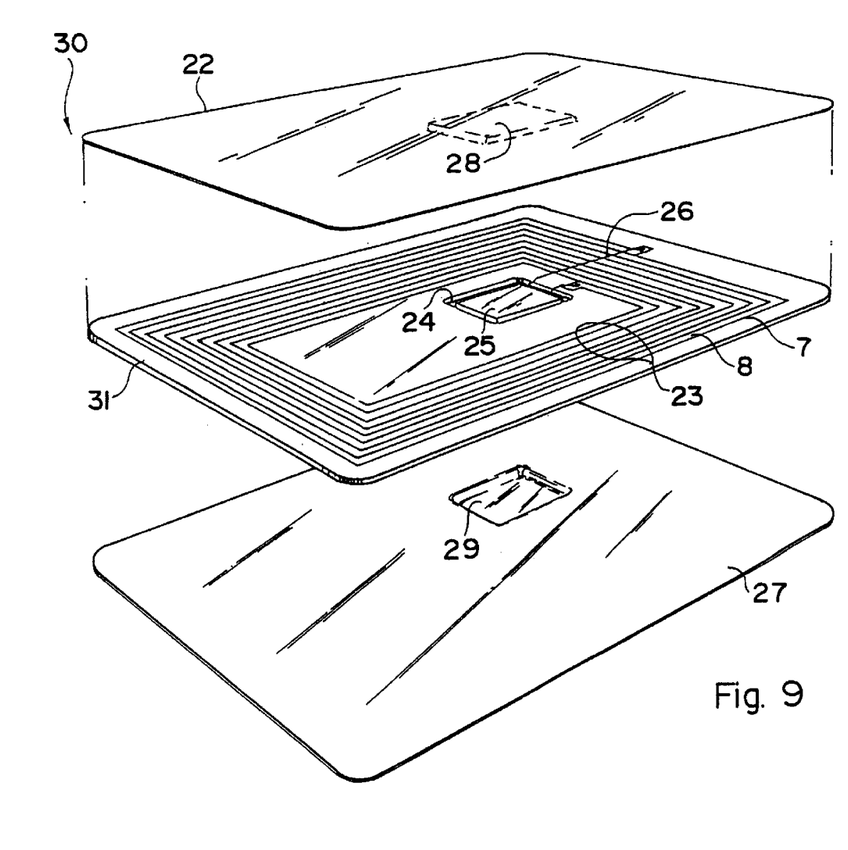

FIG. 9 illustrates a second example of a chip card 30 according to the invention.

In this example, the card is constituted by a printed circuit 31, for example a double-face printed circuit according to the example of FIG. 4, mounted between a lower protective sheet 27 and an upper protective sheet 22. The sheets 22 and 27 are mounted on the printed circuit 31 by any known means, for example by gluing, then possibly printed. In this variant, the printed circuit 31 will preferably have a minimal thickness, even though comprising, if necessary, a plurality of conducting layers on each face. Accommodations 28, respectively 29, are thus provided in the lower sheet 27 and in the upper sheet 22 for the integrated circuit 25. Of course, depending upon the application, it is likewise possible to use a single accommodation 28 or 29 and/or replace at least one of the accommodations 28 or 29 with a window permitting access to the circuit 25 or to the contacts connected to the circuit 25 from the exterior of the card.

It is evident that the variant of FIG. 9 also applies to single-face printed circuits 21.

Other methods of mounting of chip cards can be used with the printed circuits according to the invention, for example the methods which are the subject matter of the patent application WO94/22111, the text of which is incorporated herein by reference, or one of the prior art methods mentioned in that application.

Figure 10:
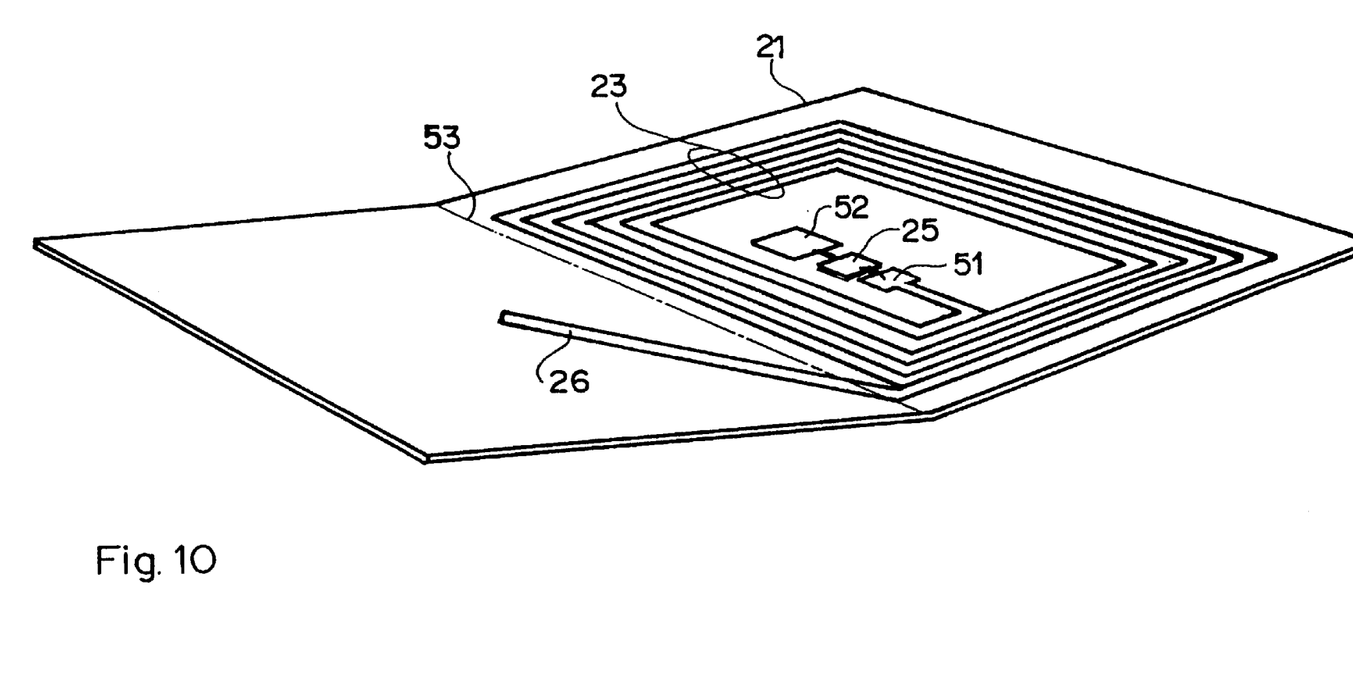

FIG. 10 shows a printed circuit in an intermediate stage of manufacture, according to a variant of the method intended to facilitate the connection between the circuit 25 and the external portion 26 of the inductive element 23. This variant is intended, for example, for security tags for protection of merchandise, but can also be applied to chip cards or to other devices. A printed circuit including a portion in the shape of an inductive element 23 is machined in the way described above on a flexible substrate 1, for example on a support of cardboard. The inductive element 23 occupies only about half of the total surface of the substrate 1. One of the ends 26 of the inductive element 23 extends on the other half of the sheet 21. This end can, for example, be constituted by a discrete wire soldered to the external portion of the inductive element 23. In a variant, this end 26 is machined by incision in the superficial conducting layer 2, in the way described above. The rest of the superficial layer 2 on this half of the sheet 21 can then be detached by leaving only the end 26 remaining.

An electronic or electric element 25 is mounted in a zone of the sheet 21 not occupied by the conducting paths, in this example on the inside of the inductive element 23. The component 25 can be, for example, an integrated circuit or a fuse. It is connected to the internal portion of the inductive element 23 by way of a zone of conductive contact 51. In addition, the element 25 is connected to a second zone of conductive contact 52 intended to establish the connection with the end 26 of the inductive element 23.

After machining of conducting paths constituting the coil and the mounting of the element 25, the half of the sheet 21 occupied by the conducting paths is covered with an insulating layer (not shown). To do this, the inductive element 23 can, for example, be covered with a layer of insulating lacquer or an insulating adhesive sheet. The zone of contact 52, however, is not covered by the insulating layer.

The sheet 21 is then folded over on itself along a folding axis 53 so that the two halves mentioned are superimposed. The end 26 of the inductive element 23 is thus put into electrical contact with the zone of contact 52. A connection is thus formed very simply between the external portion of the inductive element 23 and the element 25. The two folded halves of the sheet 21 can be fixed with respect to one another, for example by gluing.

The method according to the invention is also perfectly suitable for production of flexible printed circuits. Such circuits are used, for example, to manufacture flexible plug connectors. Moreover the method is perfectly adapted to any case where a maximal density of paths on the surface of a printed circuit must be obtained.

One skilled in the art will realise moreover that the method can also be used in combination with any other known method of printed circuit manufacture. It is possible, for example, to make cards on which part of the conducting paths are obtained or separated by electrochemical means, the rest being machined in the way specified in the claims.

One skilled in the art will realise that the term "printed circuit" has been used in this specification and in the claims by convention even though the invention applies particularly to circuits and to cards produced without the step of printing in the usual sense.

What is claimed is:

1. Method of producing a transponder (20) comprising the following steps: supplying a printed circuit (21; 31) which is made of a dielectric film (1) covered by at least one superficial conductive layer (2), creating different conducting paths in said printed circuit by mechanical machining said superficial conductive layer by means of a sharp-edged cutting tool (5, 10), separating said conducting paths by incisions (7,7',7"), without removal of conducting material or depthwise indentation, connecting of at least one electronic component (25) to said conducting paths (8); covering the said printed circuit (21; 31) by at least one sheet of protection (22; 27).

2. Method according to claim 1, wherein it further comprises the steps of superimposing on said superficial conductive layer (2), a plurality of mutually insulated, superimposed conducting layers (2, 2', 2", 2'''), separating said conducting paths by said incisions (7, 7', 7") through said plurality of superimposed conducting layers.

3. Method according to claim 1, wherein it further comprises the steps of applying on both faces of said dielectric film (1), one or more superimposed superficial conducting layers (2, 2', 2", 2'''), separating said conducting paths said incisions (7, 7', 7") through both faces of said conducting layers.

4. Method according to claim 1, wherein said cutting tool is a stamping die (5) having sharp-edged surfaces of contact (6) with the superficial conducting layer (2; 2''').

5. Method according to claim 1, wherein said cutting tool is a knife or a blade (10) cutting sequentially incisions (7, 7', 7") separating the conducting paths (8) according to a pattern recorded beforehand in an electronic memory.

6. Method according to claim 1, wherein it further comprises a step of machining in said film at least one accommodation (24) intended to accommodate an electronic component (25) connected to said conducting paths (8).

7. Method according to claim 1, wherein it further comprises a step of covering part of the conducting paths (8) by an insulating layer and a step of folding said dielectric film along a folding axis (53) in such a way as to create at least one electrical bridge (26) between portions (26, 52) of the electric paths (8) not covered by said insulating layer.

8. Method according to claim 1, wherein said at least one sheet of protection (22; 27) is assembled by gluing onto said printed circuit (21; 31).

9. Method according to claim 1, wherein in that it comprises a step of inserting a material in said incisions (7) to guarantee an electrical separation to the various conducting paths (8).

10. Method according to claim 8, wherein said at least one protective sheet (22; 27) is assembled by hot gluing onto said printed circuit (21; 31).

11. Method according to claim 1, wherein it further comprises the step of preparing, in said at least one protective sheet, a window allowing access to said at least one electronic component or to contacts linked to said electronic component from the outside of the card.

12. Transponder (20; 30) produced according to the method of one of the preceding claims.

13. Transponder (20) according to claim 12, wherein said printed circuit (21) is a circuit having conducting paths solely on a first face, said face being covered by a protective sheet (22), the face of the printed circuit (21) opposite said face being an external face of said chip card.

14. Transponder (30) according to claim 12, wherein said printed circuit (31) is a circuit having conducting paths on both faces, and in that it is mounted between a lower protective sheet (27) and an upper protective sheet (22).

* * * * *

UNITED STATES PATENT AND TRADEMARK OFFICE
CERTIFICATE OF CORRECTION

PATENT NO. : 6,176,010 B1  Page 1 of 1
DATED : January 23, 2001
INVENTOR(S) : Francois Droz It is certified that error appears in the above-identified patent and that said Letters Patent is hereby corrected as shown below:

Title page,
Under References Cited - FOREIGN PATENT DOCUMENTS, please add:
-- 610058   10/1948   (GB)
   1690542  11/1971   (DE)
   2758204A1 07/1978  (DE) --

Column 2,
Lines 38-40, please delete "According to one aspect of the invention, this object is attained by means of a method of manufacture of a printed circuit such as is specified in claim 1."
Line 60, please insert -- and -- after "aspects" and before "advantages."

Column 3,
Line 13, please change "later" to -- lateral view --.

Column 6,
Line 42, please change "substrate I" to -- substrate 1 --.

Signed and Sealed this

Sixteenth Day of October, 2001

Attest:

*Nicholas P. Godici*

NICHOLAS P. GODICI
*Attesting Officer*  *Acting Director of the United States Patent and Trademark Office*